(12) United States Patent
Hanson et al.

(10) Patent No.: US 6,236,202 B1
(45) Date of Patent: May 22, 2001

(54) COMPUTER STIMULATION OF MAGNETIC RESONANCE SPECTRA

(75) Inventors: Graeme R Hanson; Deming Wang, both of St Lucia (AU)

(73) Assignee: University of Queensland, Queensland (AU)

( * ) Notice: Subject to any disclaimer, the term of this patent is extended or adjusted under 35 U.S.C. 154(b) by 0 days.

(21) Appl. No.: 09/011,464

(22) PCT Filed: Aug. 26, 1996

(86) PCT No.: PCT/AU96/00534

§ 371 Date: Feb. 11, 1998

§ 102(e) Date: Feb. 11, 1998

(87) PCT Pub. No.: WO97/08630

PCT Pub. Date: Mar. 6, 1997

(30) Foreign Application Priority Data

Aug. 25, 1995 (AU) .................................................. PN4997

(51) Int. Cl.[7] ..................................................... G01V 3/00
(52) U.S. Cl. ............................................................. 324/300
(58) Field of Search .................................. 324/300, 306, 324/307, 309

(56) References Cited

U.S. PATENT DOCUMENTS 5,617,861 * 4/1997 Ross et al. ......................... 128/653.2

OTHER PUBLICATIONS

"Efficient molecular numerical integration schemes" (Treutler et al) Journal Chemical Physics, vol. 102 No. 1, Jan. 1995 pp. 346–354, Whole document.

"Methods for analyzing spectroscopic line shapes. NMR solid powder patterns" (Alderman et al) Journal Chemical Physics, vol. 84, No. 7, Apr. 1, 1986 pp. 3717–3725, Whole document.

"Efficient Integration of Intensity functions on the Unit Sphere" (Steinacker et al) J. Quant. Spectrosc. Radiat. Transfer vol. 56, No. 1 Jul. 1996 pp. 97–107, Abstract, fig. 2.

* cited by examiner

Primary Examiner—Louis Arana
(74) Attorney, Agent, or Firm—Nixon & Vanderhye P.C.

(57) ABSTRACT

Numerical integration of a function over a unit sphere is performed using a new partition scheme. At least one octant of the sphere is partitioned into triangular convexes, and functional values are calculated at the vertexes of the triangular convexes. Typically, an octant is partitioned into N bands, respectively containing 1, 3, 5 . . . 2N' triangular convexes. Each triangular convex may be subpartitioned into smaller triangular convexes. An interpolation method may be used to calculate functional values at points within the convexes. Typically, cubic spline interpolation is used for points along the edges of the triangular convexes, and linear interpolation is used for points within the triangular convexes. The partition method is particularly useful in computer simulation of magnetic resonance spectra as it significantly reduces computational time.

11 Claims, 6 Drawing Sheets

(a)

(b)

$N = 18$
Without Interpolation 26 min.

$N = 18$
With Interpolation 39.5 min.

$N = 200$
Without Interpolation 17 hrs. 22 min.

9300.0   12300.0   15300.0

Magnetic Field ($10^{-4}$ T)

FIG. 7

COMPUTER STIMULATION OF MAGNETIC RESONANCE SPECTRA

THIS INVENTION relates to a partition scheme for numerical integration over a sphere, particularly but not solely for use in computer simulation of magnetic resonance spectra.

BACKGROUND ART

Integration over a sphere of unit radius (the unit sphere) is, by convention, carried out by the integral $\int\int F(\alpha, \theta, \psi)\sin\theta \, d\theta d\psi$ where $\theta$ and $\psi$ are the polar and azimuthal angles, respectively and $\alpha$ may represent a set of other variables. For many physical systems, the function $F(\alpha, \theta, \psi)$ cannot be given analytically. Therefore, the integration has to be performed numerically. Numerical integration over the unit sphere involves a certain partition scheme for the unit sphere. A widely used partition scheme is the rectangular spherical grid with n equally spaced values for $\theta$, and m equally spaced values for $\psi$. Although it is simple and popular, the rectangular spherical grid partition scheme is not economical from the viewpoint of computational time because the unit sphere is partitioned unevenly. When the evaluation of $F(\alpha, \theta, \psi)$ at each orientation takes a considerable amount of computational time such as in computer reconstruction of a powder or a frozen solution magnetic resonance spectrum (EPR, solid sate NMR, NQR etc.), more evenly partitioned schemes are desired and some of these have been considered in computer simulation of magnetic resonance spectra.

Computer simulation has become a common method in magnetic resonance studies, for extracting the spin Hamiltonian parameters from randomly oriented powder spectra or spectra of disordered spin systems, as taught in references (1,2). However, this practice is still largely limited to relatively simple systems of low dimensions in spin space where analytical solutions exist or perturbation theory can be employed (2–5). A typical example is a spin $S=\frac{1}{2}$ interacting with a number of nuclear spins where the electronic Zeeman interaction dominates other interactions involved and the latter are treated as a second-order perturbation. For spin systems with $S \geq \frac{1}{2}$, perturbation theory is generally not applicable because of the presence of other equally important interactions such as the fine structure.

For a system in which a number of interactions with comparable magnitudes are present, the only solution to this problem is matrix diagonalization. That is, all of the interactions are treated with equal importance and the energy matrix is diagonalized in the entire spin space (6–11). This approach can easily become a formidable task even in the modern era of computers as diagonalization of Hermitian matrices is a $O(N^3)$ process where N is the order of the matrix. For example, with a SUN Microsystems Sparcstation 10/30 workstation, diagonalization of a 36 by 36 Hermitian matrix for both eigenvalues and eigenvectors with one of the fastest routines available, RSH (12) or LAPACK (13) routines, takes ~0.1 seconds.

A major complicating factor in computer reconstruction of randomly oriented powder spectra is anisotropy. If a system has a high degree of anisotropy, as often found in orthorhombic or lower symmetries, the randomly oriented powder spectrum has to be reconstructed from a very large number of single crystal spectra. Otherwise the simulated spectrum shows considerable ripples, computer noise. For example, a rhombic Mn(II) complex with zero-field splittings comparable with the microwave frequency will yield a spectrum spanning a field range of ~400 mT. Assuming the full widths at half maximum (FWHM) are of the order of 2 mT and that the tolerance of the resonant field position is not to exceed FWHM, then a minimum of 200 steps in $\theta$ will be required to cover 90° on an average base. By using the "Igloo" partition method (14), discussed later, some 20,000 orientations in the first octant have to be sampled. Normally, a few diagonalizations, say an average of five, are required to obtain the resonant field position for a particular transition for each orientation. For 30 allowed transitions, six from each hyperfine set, there will be a total of three million matrix diagonalizations required for the generation of the randomly oriented spectrum. Given that a single matrix diagonalization takes ~0.1 seconds on a modern computer like a SUN Microsystems Sparcstation 10/30 workstation, it would thus take 3.7 days to produce a single simulated spectrum. This is obviously impractical.

One known alternative to avoid a large number of single crystal spectrum calculations is through interpolation (6,7, 10,15). In these known interpolation methods the eigenvalues and eigenvectors are calculated exactly for only a small number of orientations while for the majority of orientations, an interpolation method is used. This automatically reduces the computing time. A number of interpolation methods have been used in conjunction with different partition schemes (6,7,10,15). Although these methods have been successfully applied to certain specific problems, there is limited generality to these methods.

Some of the known partition methods used in computer simulations are discussed below:

(1) "Apple-peel" method.

This is the simplest method to partition a sphere which involves the division of the polar angle $\theta$ from 0° to 90° in N equal steps and the azimuthal angle $\phi$ in M equal steps. Although this method is simple from the viewpoint of implementing an interpolation scheme (6,7) it is wasteful as half of the orientations (lying between $\theta=0°$ and 45°) cover less than 30% of the total solid angle of the first octant. A modification of the Apple-peel method has also been used by some (2).

(2) "Igloo" method.

The Igloo method, developed by Belford et al. (14), partitions the unit sphere more evenly. An example of this method is shown in FIG. 1(a). There are (N+1) values of $\theta$ but the number of values for $\phi$ increases from 1 at $\theta=0°$ to (N+1) at $\theta=90°$ in steps of 1. Thus the total number of orientations required in the Igloo method is (N+1)(N+2)/2 and is consequently computationally more economical than the Apple-peel method ((N+1)*M). In FIG. 1(a), N=9, (55 orientations or vertex points). However, this method is unsuitable for the incorporation of interpolation algorithms.

(3) Spiral method.

The spiral method (10) involves setting up a spiral circling about the polar axis (the z axis) of the unit sphere starting at the x axis and spiralling up to the pole. The objective of the spiral method is to keep the arc length between any consecutive points along the spiral constant, and to also keep the separation between the loops along any $\phi$ constant. The disadvantage of the spiral method is the lack of an analytical solution for determining the next point from a given point, which must be determined from a minimisation algorithm.

(4) Triangular method

Another method used in computer simulation of randomly oriented powder spectra (15) involves an equilateral triangular grid on the faces of an octahedron as shown in FIG. 1(b). (Only one octant is shown). The plane triangles on the faces of the octahedron have the same area, but they do not all subtend the same solid angle. An exact calculation of the solid angles by individual triangles is complicated and thus only an approximation was given.

SUMMARY OF THE INVENTION

This invention relates to a method for simulating magnetic resonance spectra, particularly randomly oriented powder spectra. The method involves numerical integration over at least part of a sphere. According to the invention, at least part of the sphere, e.g. an octant, is partitioned into triangular convexes. Functional values are calculated at the vertexes of the convexes, e.g. by matrix diagonalisation or perturbation theory. An interpolation method can be used to calculate the functional values corresponding to orientations on the edges of the triangular convexes and within the convexes.

Preferably, cubic spline interpolation is used for orientations on the edges of the triangular convexes, and linear interpolation is used for orientations within the triangular convexes. However, other interpolation methods may be used if desired, including higher order interpolation methods.

In the preferred embodiment, an octant of a unit sphere is partitioned into N bands respectively containing 1, 3, 5 . . . 2N−1 triangular convexes.

In order that the invention may be more fully understood and put into practice, an embodiment thereof will now be described with reference to the accompanying drawings.

BRIEF DESCRIPTION OF THE DRAWINGS

FIG. 7 illustrates computer simulations of the powder EPR spectrum of a fictitious spin system:

(a): without the interpolation scheme, N=18.

(b): with the interpolation scheme, N=18.

(c): without the interpolation scheme, N=200.

DESCRIPTION OF PREFERRED EMBODIMENT

The partition method of this invention can be applied to any portion of the unit sphere defined as $$\theta \in [0, \frac{\pi}{2}], \varphi \in [\varphi_1, \varphi_2] \text{ OR} \quad [1a]$$

$$\theta \in [\frac{\pi}{2}, \pi], \varphi \in [\varphi_1, \varphi_2] \quad [1b]$$

where, $\theta$ and $\psi$ are the polar and azimuthal angles, respectively, and without the loss of generality, $\psi_2 > \psi_1$ can be assumed. The portion of the unit sphere defined by Eqs.[1a] or [1b] is a semi-lune. For the convenience of discussion, we introduce two dimensionless variables a and b defined as $$a = \frac{\theta}{\frac{\pi}{2}}, b = \frac{\varphi - \varphi_1}{\varphi_2 - \varphi_1} \text{ or} \quad [2a]$$

$$a = \frac{\pi - \theta}{\frac{\pi}{2}}, b = \frac{\varphi - \varphi_1}{\varphi_2 - \varphi_1} \quad [2b]$$

Eqs.[2a] and [2b] correspond, respectively, to Eqs.[1a] and [1b]. Thus, for any semi-lune defined by Eq. [1], we have a $\in$ [0, 1] and b $\in$ [0, 1].

The grid points of the partition method are defined as follows. There are N+1 equally spaced values for a. The number of values for b varies from 1 to N+1 in steps of 1. The values for a and b at the grid points are $$a(i) = \frac{i}{N} (i = 0, 1, 2...N) \quad [3]$$

$$b(i, j) = \frac{j}{i} (j = 0, 1, 2...i; i \neq 0) \text{ or } b(0, 0) = 0 \ (i = 0)$$

Figure 1:
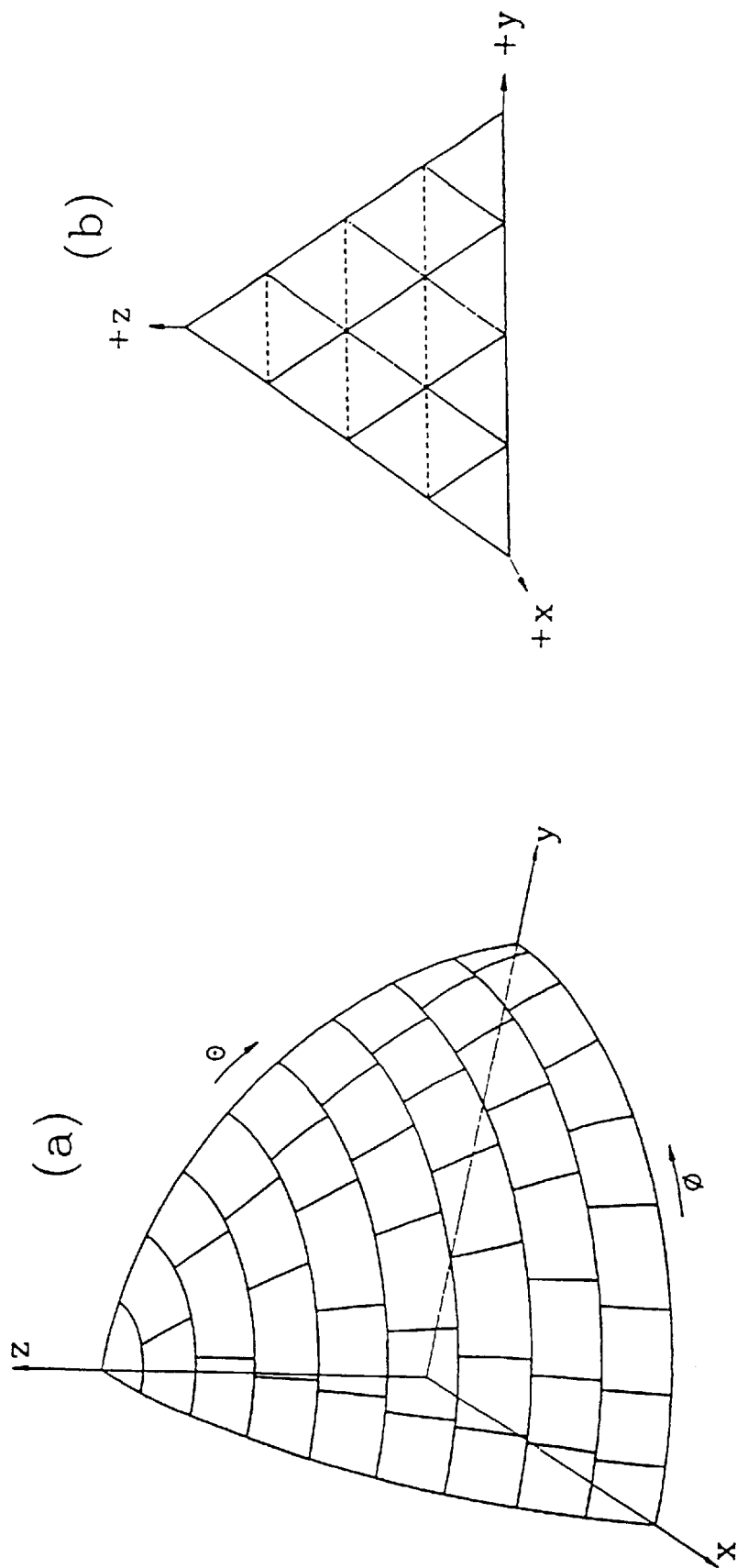
FIG. 1(a) illustrates the Igloo method for partitioning an octant of a unit sphere.
FIG. 1(b) illustrates the triangular method.
Figure 2:
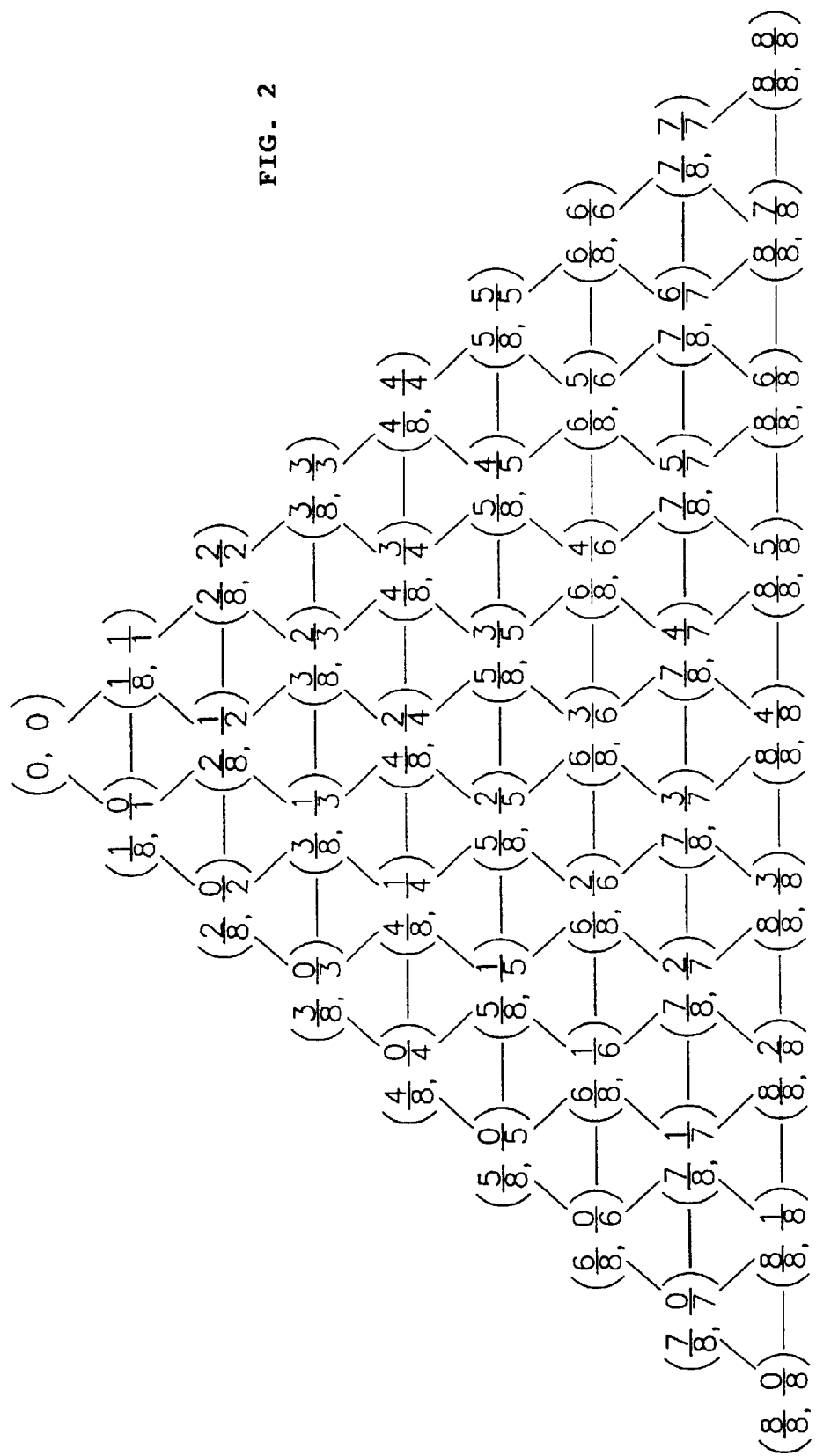
FIG. 2 is a schematic two-dimensional view of a partition (N=8) according to the method of this invention.

For N=8, the coordinates (a, b) are schematically arrayed in FIG. 2. The total number of grid points is (N+1)(N+2)/2 and for N=8, it is 45.

A unique feature of the partition method is the way of partitioning. Instead of partitioning the unit sphere into curved polygons as in the Igloo method(14), the unit sphere is partitioned into triangular convexes by three sets of curves with N curves in each set:

$$a = \frac{i}{N} \quad [4a]$$

$$ab = \frac{i-1}{N} \quad [4b]$$

$$ab = a - \frac{i-1}{N} (i = 1, 2...N) \quad [4c]$$

Figure 3:
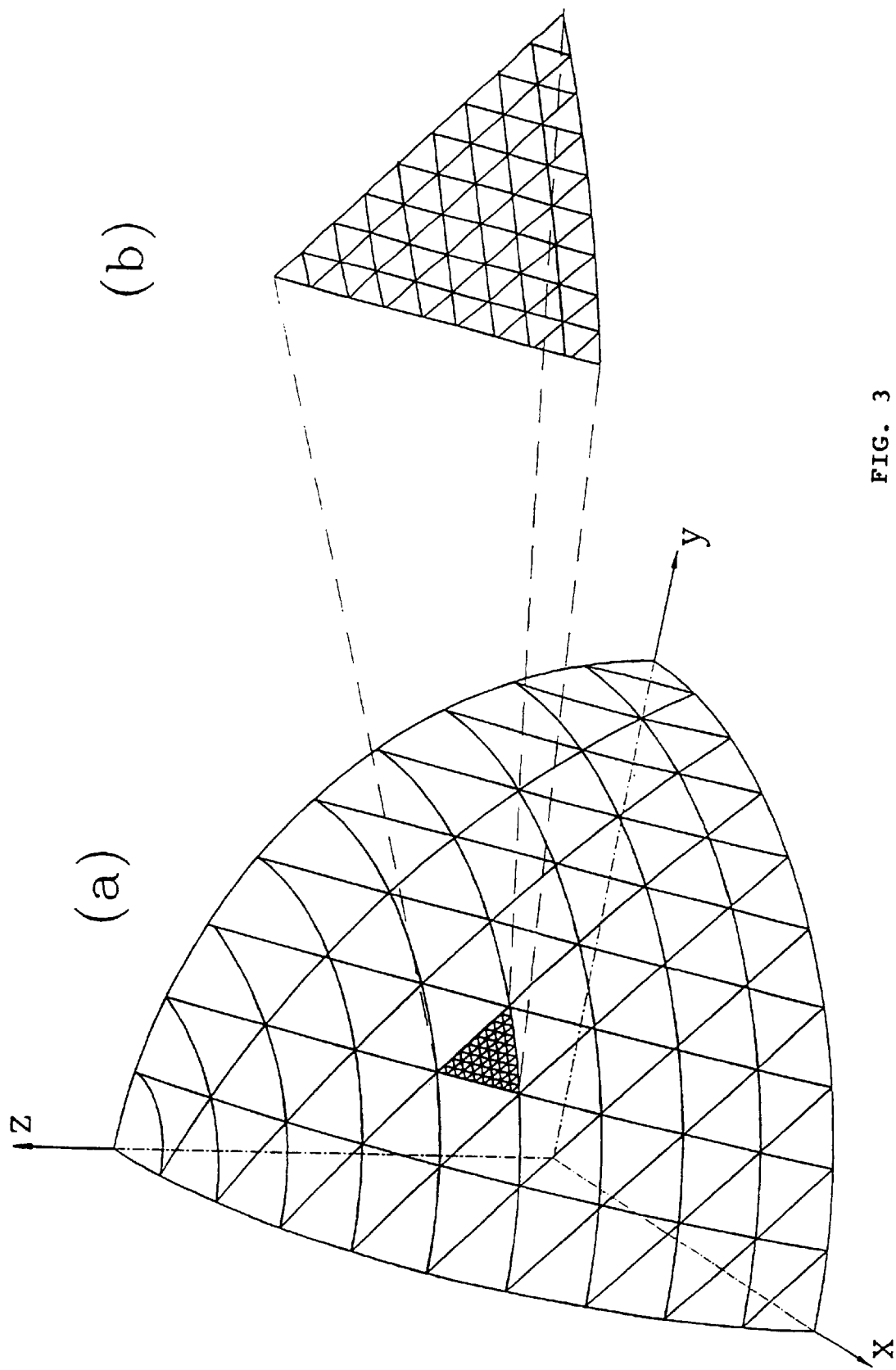
FIG. 3(a) is a schematic three-dimensional view of a further partition (N=10, $\psi_2-\psi_1=90°$) according to the method of this invention.
FIG. 3(b) illustrates the subpartition of one of the triangular convexes of FIG. 3(a), FIG. 4 schematically illustrates a subpartition (m=4) on a down ($\nabla$) and an up ($\Delta$) triangular convex taken from FIG. 2, FIG. 5 contains schematic representations of possible linear interpolation schemes, namely

For N=8, these curves are schematically represented by the broken straight lines in FIG. 2. A three-dimensional visualisation of such a partition is shown in FIG. 3(a).

The unit sphere is partitioned into triangular convexes[1]. There are N curves in each set with the number of grid points varying from 2 to N+1 in steps of 1. In essence, a partition is uniquely defined by N which is, hereafter, called the partition number. In terms of the variables $\theta$ and $\psi$, Eqs. [4] become $$\theta = \frac{\pi}{2} \frac{i}{N} \quad [5a]$$

$$\theta \varphi = \frac{\pi}{2} \frac{i-1}{N} (\varphi_2 - \varphi_1) \quad [5b]$$

$$\theta \varphi = \theta(\varphi_2 - \varphi_1) - \frac{\pi}{2} \frac{i-1}{N} (\varphi_2 - \varphi_1) (i = 1, 2, ...N) \quad [5c]$$

for $\theta \in$ [0, $\pi$/2], $\psi \in$ [$\psi_1$, $\psi_2$] and similar forms can be easily obtained for $\theta \in$ [$\pi$/2, $\pi$], $\psi \in$ [$\psi_1$, $\psi_2$]. The set of curves described by Eq.[5a] are the familiar curves of constant $\theta$.

[1]They appear to be spherical triangles but they are not necessarily so. A spherical triangle is bounded by three arcs of great circles. Here the bounded arcs are in general not part of great circles. Instead, they are called triangular nonvexes.

For a given partition number N, this method partitions a semi-lune into $N^2$ triangular convexes. Though the convexes in a given partition do not subtend the same solid angle, the solid angle of each of the individual convexes can be easily and accurately calculated. The triangular convexes can be grouped into bands and each band is defined by two curves $\theta_1=(i-1)\pi/2N$ and $\theta_2=i\pi/2N$ (i=1, 2, ... N). Thus, for a given partition number N, there are N bands with the number of triangular convexes in consecutive bands taking values from 1, 3, 5 ... up to 2N-1 (see FIGS. 2 and 3).

In each of these bands except the first one which has only one triangular convex, there are two types of triangular convexes, up ($\Delta$) and down ($\nabla$). In a given band all the up convexes subtend the same solid angle, so do all the down convexes. With the help of Eqs.[5] the solid angle subtended by each of the up triangular convexes in the band defined by $\theta_1=(i-1)\pi/2N$ and $\theta_2=i\pi/2N$, $d\omega_\Delta(i)$, is $$d\omega_\Delta(i) = -\int_{\theta_1}^{\theta_2} d\cos\theta \int_{(\varphi_2-\varphi_1)\frac{\pi}{2N}(p-1)/\theta}^{(\varphi_2-\varphi_1)[1-\frac{\pi}{2N}(i-p)/\theta]} d\varphi \qquad [6]$$

$$= (\varphi_2-\varphi_1)\left[\left(\cos(i-1)\frac{\pi}{2N} - \cos\frac{i\pi}{2N}\right) - (i-1)\frac{\pi}{2N}\int_{\theta_1}^{\theta_2}\frac{\sin\theta}{\theta}d\theta\right]$$

where p indexes the up triangular convexes taking values from 1 to i in steps of 1.

As shown, $d\omega_\Delta(i)$ is independent of the index p, thus proving that all up triangular convexes subtend the same solid angle. A similar proof for the down triangular convexes is provided by the following equation $$d\omega_\nabla(i) = -\int_{\theta_1}^{\theta_2} d\cos\theta \int_{(\varphi_2-\varphi_1)[1-\frac{\pi}{2N}(i-p)/\theta]}^{(\varphi_2-\varphi_1)\frac{\pi}{2N}p/\theta} d\varphi \qquad [7]$$

$$= (\varphi_2-\varphi_1)\left[\left(\cos\frac{i\pi}{2N} - \cos(i-1)\frac{\pi}{2N}\right) + \frac{i\pi}{2N}\int_{\theta_1}^{\theta_2} d\theta\right]$$

p now indexes from 1 through to i-1 as there are only i-1 down triangular convexes in the band. Evidently, $d\omega_\nabla(i)$ is also independent of the index p.

Both $d\omega_\Delta(i)$ and $d\omega_\nabla(i)$ can be easily calculated to any precision through Eqs.[6] and [7] as the integral $\int (\sin\theta/\theta)d\theta$ converges rapidly. However, the difference between $d\omega_\Delta(i)$ and $d\omega_\nabla(i)$ in a given band is very small especially when the partition number N is large. In a given partition, this difference is the smallest in the band (i=2) and largest in the band (i=N) with $d\omega_\nabla(i)$ being always slightly larger. If we define $k(i)=d\omega_\nabla(i)-d\omega_\Delta(i))/d\omega_\Delta(i)$ as the relative difference, k(i) is independent of ($\psi_2-\psi_1$) and is only a function of the partition number N. In Table 1, the largest (i=N) and smallest (i=2) k(i) calculated numerically are given for a few selected values of N. The differences are in general less than 1%. As numerical integration is by any means an approximate method, the difference between $d\omega_\Delta(i)$ and $d\omega_\nabla(i)$ can be justifiably ignored if N is not too small. Thus, $$d\omega_\Delta(i) \cong d\omega_\nabla(i) = \left(\cos(i-1)\frac{\pi}{2N} - \cos\frac{i\pi}{2N}\right)(\varphi_2-\varphi_1)/(2i-1) \qquad [8]$$

with i 2, 3, ... N.

Figure 4:
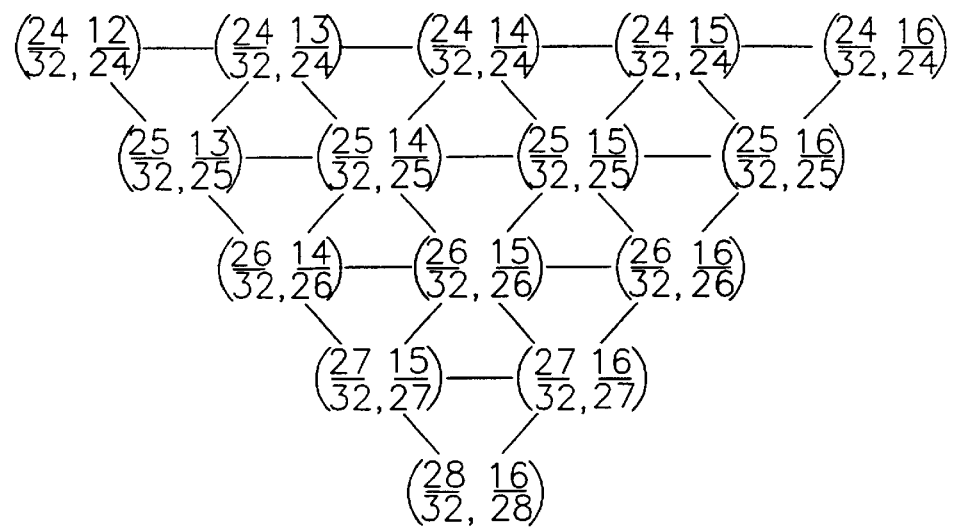
Figure 4:
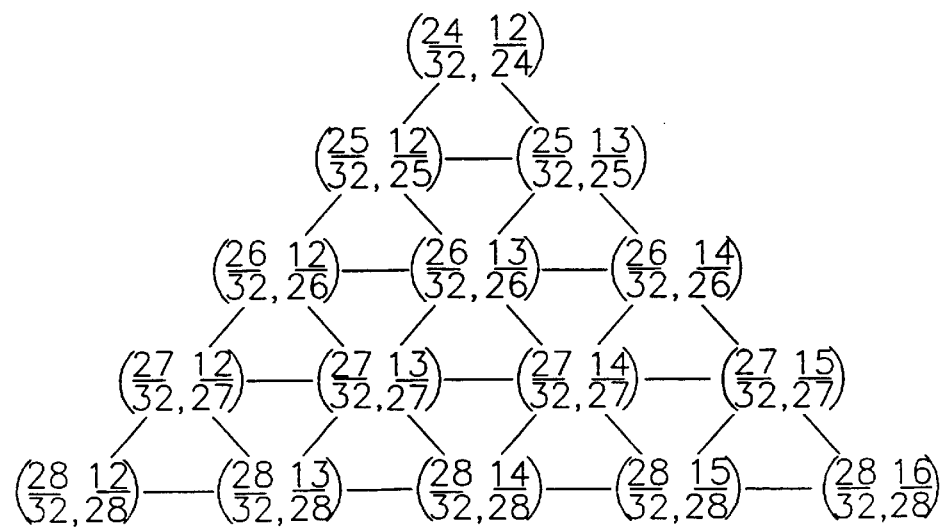

Each of the triangular convexes in a grid can be easily partitioned into smaller triangular convexes with a subpartition number m in much the same way as described above. For both up and down triangular convexes, coordinate a has a distinct value for one of the three vertex points of a given triangular convex and is the same for the other two (see FIG. 2). We label the vertex point which has the distinct a value as ($a_1$, $b_1$) and other two as ($a_2$, $b_2$) and ($a_3$, $b_3$). For an up triangular convex, $a_1<a_2$ and for a down triangular convex, $a_1>a_2$. The coordinate pair (a, b) at the grid points of such a subpartitioned triangular convex will take the following values:

$$a(k) = a_1 + (a_2-a_1)\frac{k}{m} (k = 0, 1, ...m)$$

$$b(k, l) = \frac{a_1 b_1}{a(k)} + \frac{1}{k}\left(1 - \frac{a_1}{a(k)}\right)(l = 0, 1, ...k; k \neq 0)$$

or $b(0,0)=b_1(k=0)$ [9]

which applies to both up and down triangular convexes. Note that the subpartition only depends on $(a_2-a_1)/m$, and $a_1 b_1$. Examples of subpartitioning for both the up and down triangular convexes are given in FIG. 4 and a schematic view of such a subpartition is given in FIG. 3(b). A partition with a partition number N followed by a subpartition (m) is equivalent to a partition with a partition number Nm.

This two-stage partition process is linked to a combined interpolation scheme for numerical integration over the unit sphere. This combined partition scheme (primary and secondary) in conjunction with a "global" and a "local" interpolation method, respectively, (to be discussed in more detail below), makes the method of this invention a very efficient scheme for numerical integration over the unit sphere. An additional advantage of the two-stage partition process is that each of the triangular convexes can be subpartitioned by a different subpartition number.

Most known interpolation schemes adopted to date are two-dimensional (6,7,15) with $\theta$ and $\phi$ as variables. One-dimensional interpolation has been considered (10) but only in the simplest interpolation method, linear interpolation. In most cases, linear interpolation cannot satisfactorily reconstruct the experimental spectra without performing exact calculations of the positions and spectral intensity at a very large number of orientations. When higher-order interpolation methods are considered, first derivatives with respect to $\theta$ and $\phi$ are often required. The task of calculating these first derivatives can easily become as formidable as obtaining the position/intensity information.

An advantage of this invention is that one-dimensional interpolation methods can be used, with consequent dramatic reduction in the demand for the first derivative calculations. Specifically, cubic spline interpolation is used to obtain functional values for orientations along the edges of the triangular convexes; and linear interpolation is used to obtain functional values for those orientations inside the convexes from those obtained from the cubic spline interpolations.

Cubic spline interpolation is featured by its smoothness in the first derivative and continuity in the second derivative, both within an interval and at its boundaries. Therefore, it is a good method for interpolating functional values along the edges of the triangular convexes. Strictly speaking, among the three sets of curves above, only set 1 (Eq. [5a]) involves one variable, $\phi$. The other two sets of curves involve both $\theta$ and $\phi$. However, by using Eq. [5b] and Eq. [5c], sets 2 and 3 can also be treated as involving only one variable. In both sets, $\theta$ is kept as the variable and $\phi$ is treated as a parameter, and thus one-dimensional interpolation methods can be used for all three sets.

The cubic spline interpolation process is divided into two steps (16). For a given set of data, $x_i$ and $y_i=y(x_i)$, i=1, ..., n, and two end conditions, the first step is to calculate the second derivatives $d^2y/dx^2$ (or the first derivatives, $dy/dx$) at the points $x_i$(i=1, 2, ..., n). Different types of end conditions can be used (16). Preferably, the first derivative end condition is to specify the two first derivatives at the two end points $x_1$ and $x_n$. The second derivatives are then obtained with a C function called spline in "Numerical Recipes in C" (17).

For a given value x, the second step is to find the interval within which the specified x is located. In the method of this invention, this location search has been avoided, thus saving some computing time. In the actual calculation, the second derivatives are stored. There are 6N first derivatives, 2N for each set of interpolations. This number is significantly reduced from what is required in the known two-dimensional schemes used previously (6,7). For example, in one interpolation scheme (7), a total of 3N² first derivatives were required. For a partition number of N=30, it requires 15 times as many first derivative calculations as used in the scheme of this invention.

For each set, there are N cubic spline interpolations with the number of data points from 2 to N+1 in steps of 1. The quality of the interpolated data obtained by the cubic spline interpolation was tested by comparing them with those obtained through exact calculations on a number of spin systems and the results were found to be excellent.

A specific example of an S=3/2 spin system is discussed below. The spin Hamiltonian used has the following form $$\mathcal{H} = g\beta B \cdot S + D\left[S_z^2 - \frac{1}{3}S(S+1)\right] + E(S_x^2 - S_y^2) \quad [10]$$

where the terms have their usual meanings (2). The comparison was made on a highly anisotropic system in which E/D=⅓, the so-called fully rhombic symmetry. The data for a $Cr(CN)_6^{3-}$ centre in a KCl lattice (18) was used. For this centre, D=2.73 GHz, g≡1.990 and E/D=⅓. The microwave frequency was set to 9.5 GHz.

Comparison was made on the three allowed transitions, namely 1↔2, 2↔3, 3↔4 with the energy levels numbered in order of increasing energy. In the exact calculation, a bisection method was used to locate the resonant positions with an accuracy of ±0.01 µT. (It should be pointed out that the bisection method is one of the least efficient methods in locating resonant fields and was used simply for the purpose of demonstrating the algorithm used in the method of this invention).

The resonant field position of the allowed transitions varies between 160 mT and 536 mT. Table 2 (annexed) presents a summary of the comparison. It also includes the maximum and minimum resonant fields for each transition. The data points (orientations) selected for comparison were obtained by stepping θ by 0.5° for curve sets 2 and 3, while points of separation with approximately equal arc lengths of 0.5° were selected for curve set 1. The overall agreement in Table 2 is excellent. Naturally, when N gets larger, the grid becomes finer and the agreement is better. With N=30, no data points with differences between the calculated and interpolated of larger than 0.02 mT were found for transition 3↔4 and only 12 such points were detected for transitions 1↔2 and 2↔3, which represents only 0.16% of the total number of points compared. The average deviation is very small, a few microtesla for all three transitions. A similar comparison can be made for the intensity, but normally the transition probability varies much less than the resonant field positions and so this was not included in Table 2.

Normally one would expect a better agreement for transition 2↔3 as its resonant field varies only in a small fraction of the field range spanned by the other two transitions, but the opposite is shown when comparing transition 2↔3 and 1↔2. The reason for this is that the quality of the interpolated data depends on the accuracy of the first derivatives. The first derivatives in the full diagonalization method have to be obtained numerically, and to evaluate all the first derivatives to a good precision is not an easy task. This is because first derivatives normally take values over a wide range. In this example, they vary from a few hundred µT/degree to over 10 mT/degree, and as they are not known apriori, it is impossible to choose a good value for dθ or dφ for each first derivative evaluation. In our method, the same value of de is used for all first derivative calculations. For curve sets 2 and 3, an appropriate amount of dφ is necessary which is obtained through Eq. [5b] and Eq. [5c]. For curve set 1, the values for dφ were chosen by using dφ=dθ/sinθ. The quality of the interpolated data as a function of de was tested for all three transitions and the results for transition 1↔2 are shown in Table 3 (annexed). In general, any values between 0.005° and 0.1° are acceptable. However, it was found that 0.01° was an optimal value for de for this example with the resonant field positions determined to an accuracy of ±0.01° µT.

After the global interpolation, the position/intensity/linewidth information can be viewed as a "skeleton" based on the designed grid in FIG. 3(a).

Further subpartitioning can be made for each triangular convex (FIG. 3(b)), and for any data point inside the triangular convex a linear interpolation method is used. This process can be viewed as a "tile-filling" process. One advantage of the linear interpolation method is that it does not involve any derivatives, so that no further time-consuming calculations are required. The justification of the linear interpolation relies on the anisotropy of the system under consideration and such a justification should always be achievable by varying the grid size.

Figure 5:
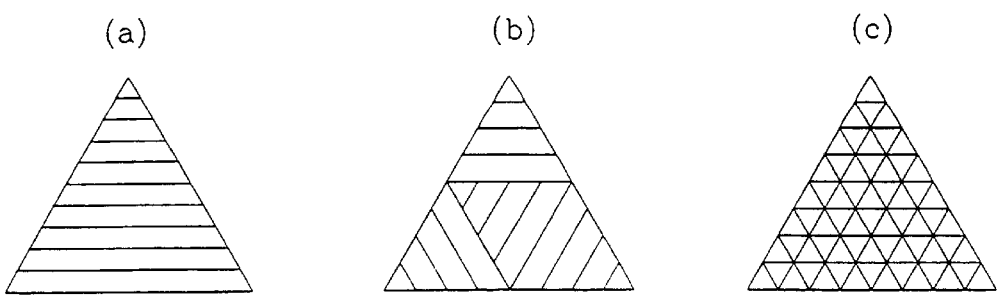
FIG. 5(a): a single set scheme.
FIG. 5(b): a combined scheme.
FIG. 5(c): an averaged scheme.

A number of linear interpolation schemes can be employed and these are shown schematically in FIG. 5. The single set scheme shown in FIG. 5(a) suits most situations where the resonant field position hardly changes along one of the edges. In this case, we linearly interpolate the data points with the set which includes the edge along which the resonant field position shows little change. For other situations, the combined (FIG. 5(b)) or the averaged scheme (FIG. 5(c)) can be used. Obviously, the averaged scheme requires more computing time. However, the averaged scheme in general produces higher quality (less ripple) simulations than the combined scheme. So, the averaged scheme is preferred. In the averaged scheme, each point inside the triangular convex is interpolated three times from three different sets and an averaged value is taken for each point.

The method of this invention is suitably implemented by computer software. Suppose the position/intensity/linewidth information for a selected transition has been obtained at the vertex points for a given partition number N through a certain method. The first derivatives required for the cubic spline interpolation are then calculated. If only the resonant position is globally interpolated, there are 6N first derivatives, 2N for each set of global interpolations. If both resonant position and intensity are globally interpolated, the number of first derivatives is simply doubled.

Second derivatives are obtained with the function spline (17). These second derivatives, together with the position/intensity/linewidth information at the vertex points, are passed on to a function which handles interpolation and convolution.

Figure 6:
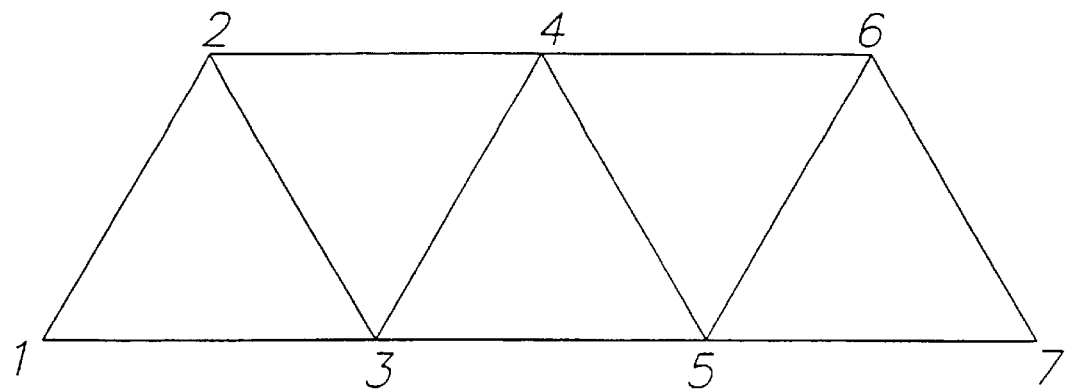
FIG. 6 illustrates the indexing scheme used in the implementation of the method of this invention.

The interpolation process is made triangular convex by triangular convex and band through band. It starts with band i=1 at the top of the grid and progresses towards the xy plane. For a given band, the data elements corresponding to the vertex points can be arranged as a one-dimensional array so that to move from one triangular convex to the next is simply to shift the index by 1. FIG. 6 shows such an indexing scheme for a band with five triangular convexes. The three vertex points which define a triangular convex are j, j+1, j+2 with j shifting from 1 to 5. Therefore, the whole interpolation/convolution process involves only repeating the same routine which handles a single triangular convex and that is how the method of this invention is implemented.

In the actual calculation, a profile of $w_{kl}$ dω against the resonant position is obtained for a selected triangular convex. $w_{kl}$ represents the intensity for the transition labelled by kl. This is done by going through all the smaller triangles into which the given triangular convex is subpartitioned. Then, the obtained profile is convoluted with a given lineshape with the linewidth averaged from those at the vertex points before adding its contribution to the final spectrum. This process is repeated for every transition.

Since electron paramagnetic resonance EPR spectroscopy is a field-swept technique, corrections for the anisotropic transition probability and linewidth have to be dealt with in a proper way in computer simulations. This is especially important for high spin systems. When perturbation theory is used, these corrections can be taken into account point by point. This normally involves calculation of the spectrum in frequency space and then transforming back into field space and requires very little additional computational time (2). However, in the full matrix diagonalization method, such point-by-point corrections become impractical. Instead, an approach (6) is used whereby the corrections for the anisotropic transition probability and linewidth are applied at the triangular level, ie. the vertex points where exact calculations are performed.

The following example will serve the purpose of demonstrating the effectiveness of the our interpolation scheme for numerical integration in computer simulation of powder spectra in magnetic resonance. In this example, the spin system is assumed to consist of an electronic spin S=3/2 and a nuclear spin i=3/2 (applicable to $^{53}$Cr EPR) described by the following spin Hamiltonian $$\mathcal{H} = g_e\beta_e B \cdot S + g_n\beta_n B \cdot I + D\left(S_z^2 - \frac{1}{3}S(S+1)\right) + E(S_x^2 - S_y^2) + S \cdot A \cdot I \quad [11]$$

where both the electronic and nuclear Zeeman interactions are assumed to be isotropic and the other two terms are the fine structure and hyperfine interaction, respectively. The values used in the simulation are: $g_e$=1.990, D=0.10 (cm$^{-1}$), E/D=0.25, $g_n$=1.50, $A_x$=120, $A_y$=120, $A_z$=240 (10$^{-4}$ cm$^-$). The other parameters were microwave frequency: 34 GHz; field axis resolution: 2048 points. An isotropic Gaussian lineshape with a half width at half maximum of 30 MHz was used in the simulation. The simulations were run on a Sun Sparcstation 10/30. The partition number was set to 18.

The simulated spectra without and with the interpolation scheme are given in FIG. 7(a) and 7(b) showing a striking contrast in quality. (The inserts are the expansion of a portion of the respective spectra in the low field region for a better presentation of the signal/noise ratio). Without the interpolation scheme, the spectral information is completely lost in the sea of computing noise whereas with the interpolation scheme, a virtually noise-free spectrum has been produced, which cost only 13.5 min. more CPU time. In order to appreciate this better, a simulation without interpolation with a much larger partition number (N=200) produced a spectrum of much lower quality (FIG. 7(c)) and consumed 17 hrs. 22 min. of CPU time.

To make the comparison into more detail, for FIG. 7(b) an average of 5.6 million data points were generated through our interpolation scheme for each of the 12 allowed transitions whereas for FIG. 7(c) there were only 20,301 data points, a mere portion of the interpolated points. If the computing noise in FIG. 7(c) is to be suppressed by half in order to unambiguously identify the transitions with weak intensities, a partition number of larger than 300 is needed (which takes more than 41 hours of CPU time). So, as demonstrated in this particular application, spectra of comparable quality can be simulated with our interpolation scheme at a significantly reduced computational time by approximately two orders of magnitude.

It is clearly shown here that the advantages of the method of this invention are its efficiency in generating a very large number of data points from those at vertexes, which are normally obtained through a time-consuming process, and its reliability. Data can be interpolated at an extremely fast speed, tens of thousand data points per second on modern computers. For example, on a SUN Microsystems Sparcstation 10/30, the data-generating speed in the interpolation process is ~50,000 points/second. Thus, this method has reduced the computing task mainly to calculating the position/intensity information at the vertex points, computing the first derivatives, sorting and convoluting. This is a remarkable improvement in computer reconstruction of randomly oriented powder spectra. In particular, this method should significantly ease the burden of simulating randomly oriented powder spectra of spin systems of large dimensions. The quality of the interpolated data has been demonstrated to be very high. The interpolated values on the edges can be expected to be very close to the true values if the first derivatives are computed with a good precision as typified in Table 3. This is important as the globally interpolated data form the base on which local linear interpolations are performed.

For orthorhombic symmetries only one octant is required, while for monoclinic ($C_2$, $C_{2h}$ and $C_s$) and triclinic ($C_i$) symmetries two and four octants are required respectively.

Subpartitioning of each triangular convex can also be easily made on an individual basis. That is, the extent to which each individual triangular convex is subpartitioned into smaller triangles is determined by the difference in the resonant field positions at the three vertex points. In other words, it can be determined by the "local" anisotropy for a given transition. So, the method of this invention has a great flexibility in that it handles the anisotropy step by step through the space, and, of course, transition by transition.

The method of this invention is a general method for simulating randomly orientated magnetic resonance spectra. It can be used for any computer reconstruction where the spectral function has to be sampled at a very fine grid of the unit sphere, i.e. at a very large number of orientations, and sampling at each orientation takes a considerable amount of computing time. For example, the method can be used in simulating randomly oriented powder spectra in solid state NMR, electron nuclear double resonance (ENDOR), electron spin echo envelope modulation (ESEEM), Mossbauer and nuclear quadrupole resonance spectroscopy in solids.

The use of the partition scheme of this invention in a process to determine spin Hamiltonian parameters from an EPR spectrum by computer simulation will now be described briefly below. The computer simulation can be based on matrix diagonalisation techniques, or perturbation theory (second, third, fourth order).

An experimental EPR spectrum is recorded as a two-dimensional array (x,y) of data, where x represents the magnetic field strength and y the spectral intensity which is proportional to the amount of microwave energy absorbed by the spin system on resonance. For a randomly oriented spin system such as powder or a frozen solution, the constituent molecules which make up the spin system are randomly oriented with respect to the direction of the magnetic field, making contributions to the spectrum normally at different magnetic field strength. Therefore, a computer simulation is used to calculate theoretically those contributions made by bundles of molecules with their molecular axes at different angles to the direction of the magnetic field, for a given set of instrumental, spectral and simulation parameters. By "randomly oriented" we mean that the number of molecules in a given elemental solid angle is proportional to that solid angle irrespective of where the elemental solid angle is taken in the entire sphere. By virtue of symmetry, two bundles of molecules with their molecular axes related by symmetry make identical contributions to the spectrum. In order to save computing time, only those bundles with distinctive orientations need to be considered. In other words, instead of calculating contributions of all the molecules spreading evenly across the entire sphere, only those in one or two octants are normally required, depending on the symmetry of the system.

The process can be summarised as follows:
1. A set of instrumental, spectral and simulation parameters are input.
2. The symmetry of the spin system is defined. This will consequently determine the number of octants which need to be considered (see the following chart).

| Symmetry | θ (degree) | Ψ (degree) | number of octants |
|---|---|---|---|
| axial | 0–90 | 0 | 0 |
| rhombic | 0–90 | 0–90 | 1 |
| monoclinic | 0–90 or 0–180 | 0–180 0–90 | 2 |
| triclinic | 0–180 | 0–180 | 4 |

3. A grid, partitioned by the method of this invention, is set up (see FIG. 2).
4. If transition labels (optional as an input parameter) are not given, a global search for all transitions which have their transition probabilities (proportional to the amount of microwave absorbed when at resonance) above a threshold input value is carried out at a few orientations. These are normally selected from the vertexes of the set-up grid.
5. A search for all transitions with magnetic field pointing at the vertexes of the grid is commenced. The search for each orientation includes the resonant field positions of the transitions which define their x-axis positions and the transition probabilities which give the spectral intensities (the y-axis). In a matrix diagonalisation approach, this search includes setting up the energy matrix, diagonalising the matrix for eigenvalues and eigenvectors at a number of selected magnetic field strengths which are normally distributed evenly across the spectral width (the range of the x-axis). Then a second-order eigen field perturbation theory is used for locating the resonant field positions of the transitions. If a perturbation theory is used instead of full matrix diagonalisation, both resonant field positions and transition probability are calculated analytically.
6. For any other orientations, the resonant field positions and the transition probabilities are obtained through interpolation schemes, namely the global spline interpolation for orientations on the edges of the grid and the combined linear scheme (see FIG. 5(c)) for those inside the triangular convexes.
7. To determine the contribution of each located transition to the spectrum, a spectral line shape (normally Gaussian or Lorentzian, also an input parameter) is applied with the centre of the line taking at the calculated resonant field position, and its intensity multiplied by the transition probability, also weighted by the solid angle occupied by the bundle of the molecules contributing to that transition.
8. Step 7 is carried out for all the transitions, and all the orientations defined by the operator and the contributions are additively stored in an array to yield the final simulated spectrum.

The simulated spectrum is then compared with the experimental spectrum. If the agreement is satisfactory, the input spectral parameters (namely the spin Hamiltonian parameters) used to generate the simulated spectrum have been satisfactorily extracted from the experimental spectrum. If not, the input spectral parameters are adjusted and the simulated spectrum is recalculated per steps 1 to 8 above.

The foregoing describes only some applications of the partition method of this invention. The partition method can also be used in other applications requiring numerical integration over a sphere or part thereof. For example, the partition method of this invention may be used in the rendering of spherical surfaces in computer graphics, as well as the design of geodesic domes in architecture.

TABLE 1

The smallest k(i = 2) and largest k(i = N) of the relative difference of the solid angles subtended by the up and down triangular convexes, k(i) = (dω$_\nabla$(i) - dω$_\Delta$(i) )/ dω$_\Delta$(i) in a given band i for a few selected partition numbers N = 18,45,90, and 180. Δθ$^a$ = π/2N is the corresponding step for θ.

| N | Δθ[a] | k(i = 2) | k(i = N) |
|---|---|---|---|
| 18 | 5° | 0.00127148 | 0.01793619 |
| 45 | 2° | 0.00020313 | 0.00731413 |
| 90 | 1° | 0.00005077 | 0.00368037 |
| 180 | 0.5° | 0.00001269 | 0.00184601 |

TABLE 2

Comparison of the resonant fields interpolated through the global cubic spline interpolation ($B_{interpol}$) with those calculated by full matrix diagonalization ($B_{exact}$).

| N[a] | dθ[b] (degrees) | $N_p$[c] | K1[d] | K2[e] | Average Deviation[f] (μT) |
|---|---|---|---|---|---|
| 34 ↔ 4 | $B_{max}^B$ = 536.0039 (y axis) | $B_{min}$ = 160.7016 (z axis) | | | |
| 18 | 0.01 | 4842 | 0 | 3 | 0.9 |
| 24 | 0.01 | 6488 | 0 | 0 | 0.31 |
| 30 | 0.01 | 7480 | 0 | 0 | 0.16 |
| 1 ↔ 2 | $B_{max}$ = 536.0039 (z axis) | $B_{min}$ = 160.7016 (y axis) | | | |
| 18 | 0.01 | 4842 | 19 | 71 | 1.97 |
| 24 | 0.01 | 6488 | 9 | 26 | 0.69 |
| 30 | 0.01 | 7480 | 0 | 12 | 0.33 |
| 2 ↔ 3 | $B_{max}$ = 330.5821 (y or z axis) | $B_{min}$ = 299.7798 (x axis) | | | |
| 18 | 0.01 | 4842 | 19 | 70 | 1.68 |
| 24 | 0.01 | 6488 | 7 | 25 | 0.59 |
| 30 | 0.01 | 7480 | 0 | 12 | 0.29 |

[a]N is the partition number.
[b]dθ is the step used for evaluating the first derivatives.
[c]$N_p$ is the total number of data points compared.
[d]K1 is the number of data points for which ΔB ≥ 50 μT (ΔB = |$B_{interpol}$ − $B_{exact}$|).
[e]K2 is the number of data points for which ΔB ≥ 20 μT.
[f]Average deviation is defined as the average of ΔB for all the points compared.
[g]$B_{max}$ (mT) and $B_{min}$ (mT) are the maximum and minimum resonant field positions when the magnetic field is applied along the axes shown in brackets.

TABLE 3

Comparison of the resonant fields interpolated through the global cubic spline interpolation method ($B_{interpol}$) with those calculated by the full matrix diagonalization method ($B_{exact}$) for transition 1←→2 with different values of d$\theta$[a].

| N | d$\theta$ (degrees) | $N_p$ | K1 | K2 | Average Deviation ($\mu T$) |
|---|---|---|---|---|---|
| 30 | 0.005 | 41290 | 0 | 57 | 0.33 |
| 30 | 0.01 | 41290 | 0 | 55 | 0.31 |
| 30 | 0.05 | 41290 | 0 | 66 | 0.51 |
| 30 | 0.1 | 41290 | 7 | 116 | 0.82 |
| 30 | 0.5 | 41290 | 496 | 2091 | 3.5 |
| 30 | 1 | 41290 | 2632 | 4873 | 53.3 |
| 30 | 3 | 41290 | 6902 | 10058 | 98 |

[a]The symbols have the same definitions as in Table 2. Here a smaller step of 0.1° (0.5° was used for Table 2) was used in selecting the points for comparison in order to show there were absolutely no oscillations in the interpolation. Consequently the total number of data points increases from 7480 to 41290 for N = 30. The vertex points were excluded in all comparisons.

References

1. P. C. Taylor, J. F. Baugher and H. M. Kriz, *Chemical Reviews*, 75, 203 (1974), and references therein.
2. J. R. Pilbrow, "*Transition Ion Electron Paramagnetic Resonance*", Clarendon Press, Oxford (1990), and references therein.
3. G. M. Muha, *J. Magn. Reson.* 49, 431 (1982); 53, 85 (1983).
4. Y. Siderer and Z. Luz, *J. Magn. Reson.* 37, 449 (1980).
5. L. Andreozzi, M. Giordano and D. Leporini, *J. Magn. Reson. Series A* 104, 166 (1993).
6. G. van Veen, *J. Magn. Reson.* 38,91 (1978).
7. M. C. M. Gribnau, J. L. C. van Tits, and E. J. Reijerse, *J. Magn. Reson.* 90 474 (1990).
8. G. G. Belford, R. L. Belford and J. F. Burkhalter, *J. Magn. Reson.* 11, 251 (1973).
9. A. Kretter and J. Huttermann, *J. Magn. Reson.* 93, 12 (1991).
10. M. J. Mombourquette and J. A. Weil, *J. Magn. Reson.* 99, 37 (1992).
11. L. Cugunov, A. Mednis and J. Kliava, *J. Magn. Reson. Series A* 106, 153 (1994).
12. M. Krusche, M. Neu, H. Ziegler, *J. Magn. Reson.* 95, 368 (1991).
13. E. Anderson, Z. Bai, C. Bischof, J. Demmel, J. Dongarra, J. Du Croz, A. Greenbaum, S. Hammarling, A. McKenney, S. Ostrouchov, D. Sorensen, "LAPACK Users' Guide", Society for Industrial and Applied Mathematics, Philadelphia (1992).
14. (a) M. J. Nilges, Ph.D thesis, University of Illinois, Urbana, Ill., (1979); (b) R. L. Belford and M. J. Nilges, Computer Simulation of Powder Spectra, EPR Symposium 21st Rocky Mountain Conference, Denver, Colo., (1979); (c) A. M. Maurice, Ph.D thesis, University of Illinois, Urbana, Ill.
15. D. W. Alderman, M. S. Solum and D. M. Grant, *J. Chem. Phys.* 84, 3717 (1986).
16. Su Bu-qing and Liu Ding-yuan, "*Computational Geometry—Curves and Surface Modeling*", Academic Press (1989).
17. W. H. Press, S. A. Teukolsky, W. T. Vetterling and B. P. Flannery, "*Numerical Recipes in C*", Cambridge Press, Cambridge, p113 (1992).
18. D. M. Wang, D. H. Hutton and J. R. Pilbrow, *J. Phys. C,* 19, 789 (1986).

What is claimed is:

1. A method of simulating magnetic resonance spectra involving numerical integration of a function over at least a portion of a sphere, comprising the steps of partitioning the portion of the sphere into triangular convexes, and calculating function values for orientations corresponding to the vertex points of the triangular convexes; and simulating said magnetic resonance spectra using said functional values.

2. A method as claimed in claim 1, further comprising the step of using interpolation to calculate functional values for orientations corresponding to points on the edges and/or within the triangular convexes.

3. A method as claimed in claim 1 wherein the portion of the sphere includes at least one octant, and the octant is partitioned into N bands respectively containing 1, 3, . . . 5, 2N-1 triangular convexes.

4. A method as claimed in claim 1 further comprising the step of subpartitioning the triangular convexes into smaller triangular convexes.

5. A method as claimed in claim 4, wherein the triangular convexes are subpartitioned by different subpartition numbers.

6. A method as claimed in claim 4, wherein the extent to which a triangular convex is subpartitioned is determined by the difference in resonant field positions corresponding to the three vertex points of the triangular convex.

7. A method as claimed in claim 2 wherein the interpolation step includes cubic spline interpolation for orientations corresponding to points along the edges of the triangular convexes.

8. A method as claimed in claim 2, wherein the interpolation step includes linear interpolation for orientations corresponding to points within the triangular convexes.

9. A method as claimed in claim 3, wherein the calculation of functional values at the vertexes of the triangular convexes in one band is made progressively through successive convexes in that band.

10. A method as claimed in claim 1, wherein the calculation of functional values at the vertexes of the convexes involves matrix diagonalisation.

11. A method as claimed in claim 1, wherein the calculation of functional values at the vertexes of the triangular convexes involves a perturbation method.

* * * * *

UNITED STATES PATENT AND TRADEMARK OFFICE
CERTIFICATE OF CORRECTION

PATENT NO. : 6,236,202 B1  
DATED : May 22, 2001  
INVENTOR(S) : Hanson

Page 1 of 1

It is certified that error appears in the above-identified patent and that said Letters Patent is hereby corrected as shown below:

<u>Title page,</u>
Item [54], change "STIMULATION" to -- SIMULATION --.

Signed and Sealed this

Twenty-sixth Day of March, 2002

Attest:

*Attesting Officer*

JAMES E. ROGAN  
*Director of the United States Patent and Trademark Office*